United States Patent
Haigh

(10) Patent No.: US 8,248,776 B2
(45) Date of Patent: Aug. 21, 2012

(54) METHOD AND APPARATUS FOR STORAGE OF CABLES

(75) Inventor: David C. Haigh, Havant (GB)

(73) Assignee: Xyratex Technology Limited, Havant (GB)

( * ) Notice: Subject to any disclaimer, the term of this patent is extended or adjusted under 35 U.S.C. 154(b) by 205 days.

(21) Appl. No.: 12/859,602

(22) Filed: Aug. 19, 2010

(65) Prior Publication Data

US 2012/0044626 A1  Feb. 23, 2012

(51) Int. Cl.
*G06F 1/16* (2006.01)

(52) U.S. Cl. .............. 361/679.33; 242/563; 33/576; 114/253

(58) Field of Classification Search .......... 385/136, 385/112, 110, 101, 111, 100, 135; 242/373, 242/578.2, 388.6, 563, 407, 588.3, 388.1; 355/55; 361/679.33, 679.37, 679.46, 679.31, 361/679.54, 679.52, 679.39, 679.22, 679.4, 361/689.38; 33/527, 228, 576, 756, 701; 376/202, 190; 174/24, 107, 110 PM, 120 R, 174/68.1, 50, 75 C See application file for complete search history.

(56) References Cited

U.S. PATENT DOCUMENTS

| | | | |
|---|---|---|---|
| 5,622,333 A * | 4/1997 | Jacques ............... | 242/578.2 |
| 6,014,713 A | 1/2000 | Agnew et al. | |
| 6,019,304 A * | 2/2000 | Skowronski et al. ...... | 242/373 |
| 6,511,009 B1 | 1/2003 | Harrison et al. ........ | 242/388.5 |
| 6,640,041 B2 * | 10/2003 | Ichinari et al. ............ | 385/136 |
| 6,915,058 B2 | 7/2005 | Pons | |
| 7,116,883 B2 | 10/2006 | Kline et al. ............ | 385/135 |
| 7,627,218 B2 | 12/2009 | Hurley | |

FOREIGN PATENT DOCUMENTS

EP  0 519 210  12/1992

* cited by examiner

*Primary Examiner* — Hung Duong
(74) *Attorney, Agent, or Firm* — Pillsbury Winthrop Shaw Pittman LLP

(57) ABSTRACT

There is provided a storage reel for storage of cable. The storage reel comprises a first cable reel having a first reeling surface arranged to store wound communication cable thereon, a second cable reel having a second reeling surface arranged to store wound communication cable thereon and a connecting member arranged to connect said first and second cable reels. The storage reel is rotatable about an axis such that, in use, the storage reel is operable to wind cable across both the first and second reeling surfaces.

23 Claims, 7 Drawing Sheets

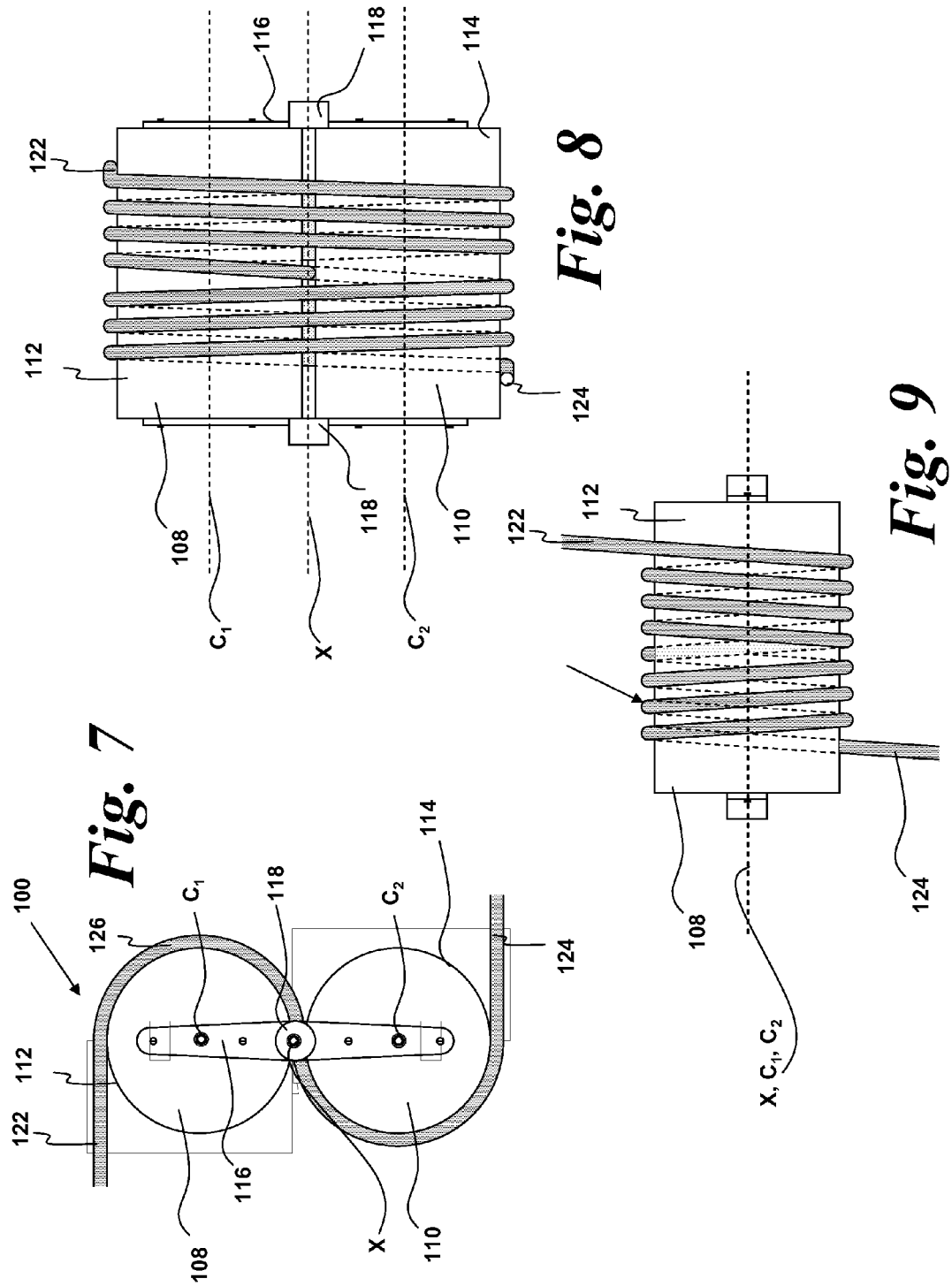

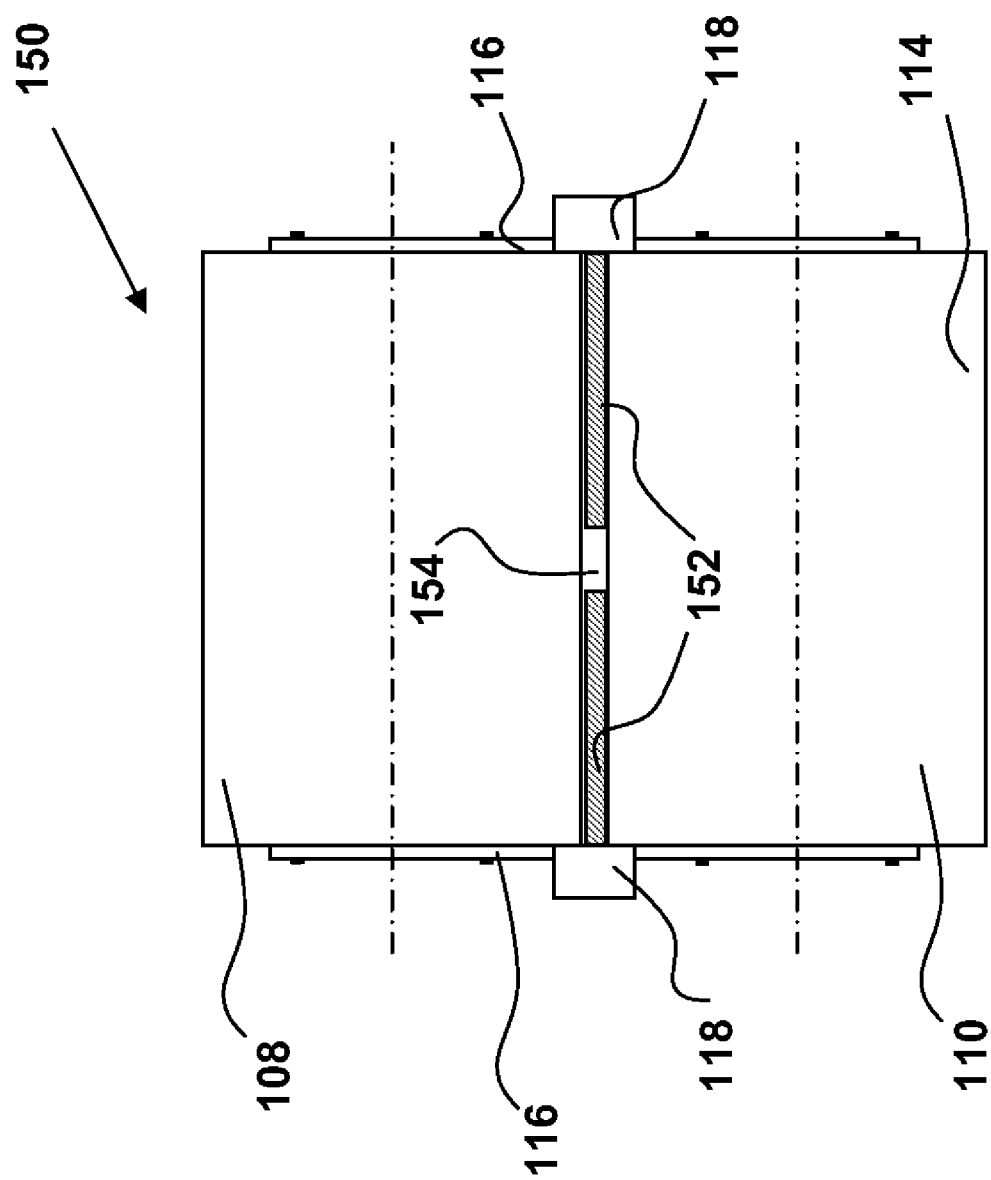

METHOD AND APPARATUS FOR STORAGE OF CABLES

The present invention relates to a method of, and apparatus for, storage of cables. More particularly, the present invention relates to a storage reel arrangement for storage of communication cable.

Communication cables are used in many electronic systems to connect, for example, components in a computing system. Both conventional metal cables and fibre optic cables are widely used.

Fibre optic cables are commonly found in communications systems for carrying information between components in a computer network. A typical example may be the use of optical fibres in an optical cross-connect system for a communications network.

In many situations, it is not space-efficient or practical to have a large amount of loose cabling between two devices. Therefore, it is useful to coil cables on, for example, a spool in order to enable efficient and tidy storage of these cables.

Commonly, fibre optic cable comprises a core, cladding, a buffer layer and an outer jacket. The core is arranged to transmit optical signals and is typically formed from glass for high bandwidth optical transmission of information, although in some cases plastic may be used. The surrounding cladding is provided to maintain the light within the core and generally comprises a material having a lower refractive index than the core in order to maintain total internal reflection conditions within the core, and so prevent leakage of light from the core. The buffer layer and outer jacket are provided to, protect the core and cladding from damage from the external environment and to provide additional optical shielding.

Typically, due to the construction of fibre optic cables, they can suffer only a particular amount of deformation due to bending before degradation occurs. For some optical fibres, a degree of bending of the fibre may result in some leakage of light from the fibre due to the critical angle for total internal reflection being exceeded. However, a larger issue is that the fibre core can become micro-fractured and damaged by excessive bending. These cracks and fractures can propagate through the cable, leading to a loss in transmission through the cable. Ultimately, the cable will degrade to such an extent that it will require replacement. Therefore, it is important to avoid damaging the fibre through excessive bending.

For such cables, a minimum bend radius is defined. If the cable is bent to circumscribe a part-circle, the radius of that circle must not be less than the minimum bend radius otherwise damage will occur to the cable. In other words, the minimum bend radius defines the tightest curve that the cable can be bent to form without suffering damage. Whilst the minimum bend radius is of particular importance in the handling of fibre optic cables, it is also applicable to other cable designs; for example, some types of coaxial cable or other cables comprising semi-rigid internal components.

Additionally, electrical cables, e.g. for the transmission of electrical power, may also fall within this category. Such cables may be required to power electrical devices and, to meet safety requirements, the cable may have a minimum bend radius to ensure integrity of the cable and internal components.

As set out above, the minimum bend radius of a particular cable places a constraint on the minimum diameter of a conventional cable reel because the minimum diameter of a cable reel must not be less than twice the minimum bend radius of the cable.

However, in many instances, the cable reel is desired to be stored between the two components connected by the cable. In this arrangement, the cable will enter the reel in one direction and exit the reel in the same direction. In some situations, the components will be required to move relative to one another to enable, for example, access or repair. Consequently, the reel may need to wind/unwind cable in both directions. It may even be required to move with the movable component.

Such a situation may arise, for example, where a movable drawer containing hard disk drives (HDDs) is connected to a fixed circuit board or other fixed apparatus in the enclosure by a cable or cables. The cable connections must be maintained for all positions of the drawer. When the drawer is fully withdrawn a certain length of cable is clearly required to maintain connections. When the drawer is in the fully closed position, the cable must be wound up without tangling or fouling other objects in the enclosure.

However, in an arrangement whereby the cable is wound onto a cable reel in both directions, the cable must enter and exit the cable reel substantially perpendicular to the axis of the cable reel. Further, to facilitate winding, the cable must enter the cable reel at a top part thereof and exit at a lower part thereof, or enter and exit at any diametrically opposite parts.

In order to facilitate this change of position and direction without violating the minimum bend radius of the cable, the cable reel must have sufficient diameter to accommodate an internal S-bend in the cable. Examples of such an internal arrangement are described in U.S. Pat. No. 7,116,883, U.S. Pat. No. 6,511,009, EP-A-0 519 210 and U.S. Pat. No. 6,640,041.

A schematic example of such an arrangement is shown in FIGS. 1 and 2. In FIGS. 1 and 2, a cable reel 10 is shown. The cable reel 10 is rotatable about an axis X and comprises a reeling surface 12. A cable 14 is connected to the cable reel 10 and comprises a first portion 16 which enters the cable reel 10 at an upper portion of the cable reel 10 and a second portion 18 which exits the cable reel 10 at a lower portion thereof.

In between the first and second portions 16, 18 lies a third portion of the cable 14 which passes internally through the interior of the cable reel 10. The third portion 20 is formed into an S-shape within the interior of the cable reel 10 and is guided by a guide 22 formed within the interior of the cable reel 10. The guide 22 is arranged to guide the third portion 20 of the cable 14 into an S-shape with a radius of curvature R equal to, or greater than, the minimum bend radius of the cable 14.

FIG. 1 shows the cable reel 10 with the cable 14 unwound. FIG. 2 shows the cable reel 10 with the cable 14 wound onto the reeling surface 12. As shown in FIGS. 1 and 2, the requirement for the S-bend guide 22 with a radius of curvature no less than the minimum bend radius of the cable 14 means that the diameter of the cable reel 10 as a whole (i.e. the distance between opposing reeling surfaces 12) must be at least four times the minimum bend radius.

Whilst the minimum bend radius varies in dependence upon the cable type, the smallest minimum bend radius for a modern fibre optic cable is approximately 5 mm. Therefore, in this configuration, the minimum diameter of the cable reel 10 must be at least 20 mm for a minimum bend radius of 5 mm. This may still be too large for some applications where only a small space is available for a cable reel.

Therefore, known cable reel arrangements suffer from a technical problem that the size of the cable reel cannot be reduced below a minimum of four times the minimum bend radius of the cable to be stored without causing damage to the cable. This requires increased storage space for the cable reel and reduces the amount of other equipment which may be integrated into a particular area or enclosure.

According to a first aspect of the present invention, there is provided a storage reel for storage of cable, said cable being connectable to electrical and/or optical devices and said storage reel comprising: a first cable reel having a first reeling surface arranged to store wound communication cable thereon; a second cable reel having a second reeling surface arranged to store wound communication cable thereon; and a connecting member arranged to connect said first and second cable reels, wherein the storage reel is rotatable about an axis such that, in use, the storage reel is operable to wind cable across both the first and second reeling surfaces.

By providing such an arrangement, a smaller storage reel can be provided without exceeding the minimum bend radius of the cable in question. By providing a smaller storage reel, a more compact installation is possible; reducing the footprint of the attached equipment and providing additional storage space for components of the system into which the storage reel is integrated.

In one embodiment, at least one of the first and second cable reels is cylindrical. In a further embodiment, both the first and second cable reels are cylindrical.

In one arrangement, the first and second cable reels each have an axis and the axes of each of the first and second cable reels are parallel and spaced from one another.

In a further arrangement, the axis of each of the first and second cable reels is parallel and spaced from the axis of rotation.

In one variation, the storage reel is asymmetric in different dimensions perpendicular to the axis of rotation. In a further variation, the storage reel extends in first and second dimensions perpendicular to the axis of rotation, and the storage reel is dimensioned to extend at least twice as far in the first dimension as the second dimension.

In one arrangement, the storage reel is further operable to locate said cable thereon by passing said cable around at least a part of said first reeling surface, between said first and second cable reels and around at least a part of said second reeling surface.

In a variation, said first and cable reels are spaced to enable said cable to pass therebetween.

In an alternative variation, said first and second cable reels form part of a unitary structure, said unitary structure comprising an aperture between said first and second cable reels operable to enable said cable to pass therethrough.

In one arrangement, said cable comprises electrical cable for transmission of electrical power.

In another arrangement, said cable comprises communication cable for transmission of optical or electronic signals.

According to a second aspect of the invention, there is provided a storage reel assembly, comprising at least one slide rail and the storage reel of the first aspect, wherein said at least one slide rail has an axis and is operable to enable said storage reel to slide thereon along said axis.

In one arrangement, the axis of said slide rail is coincident and perpendicular to said axis of rotation of said storage reel.

In one arrangement, said cable comprises a fibre optic cable.

In one arrangement, the axis passes through said connecting member between said first and second cable reels.

According to a third aspect of the invention, there is provided a storage device for containing electronic components, said storage device comprising: a frame; and at least one drawer movable with respect to said frame; said frame comprising a first device and said drawer comprising a second device, said first and second devices being connected by cable, wherein said cable comprises communication cable and is stored on a storage reel according to claim 1.

In one arrangement, said first electronic device comprises an optical printed circuit board and said second electronic device comprises at least one data storage device.

In another arrangement, the or each data storage device comprises a hard disk drive.

According to a third aspect of the present invention, there is provided a method of storing cable, said cable being connectable to electronic and/or optical devices and said method comprising: providing a storage reel, said storage reel being rotatable about an axis and having: a first cable reel having a first reeling surface arranged to store wound communication cable thereon; a second cable reel having a second reeling surface arranged to store wound communication cable thereon; and a connecting member arranged to connect said first and second cable reels, the method further comprising: the method further comprising: receiving a first part of the cable at a portion of said first reeling surface; receiving a second part of the cable at a second portion of said second reeling surface; and guiding the cable around said first reeling surface, between said first and second cable reels, and around said second reeling surface.

In one variation, the method further comprises winding cable across both the first and second reeling surfaces to store said cable thereon.

In one embodiment, said cable comprises electrical cable for transmission of electrical power.

In another embodiment, said cable comprises communication cable for transmission of optical or electronic signals.

Embodiments of the present invention will now be described in detail with reference to the accompanying drawings, in which:

FIG. 7 is a schematic diagram of the end of a storage reel shown in FIG. 3 showing a length of cable located thereon;

FIG. 8 is a schematic diagram of the side of the storage reel of FIG. 7 showing a length of cable wound thereon;

FIG. 9 is a schematic diagram of a plan view of the storage reel shown in FIG. 8;

FIG. 10 is a schematic diagram of the side of a storage reel according to an alternative embodiment;

Figure 3:
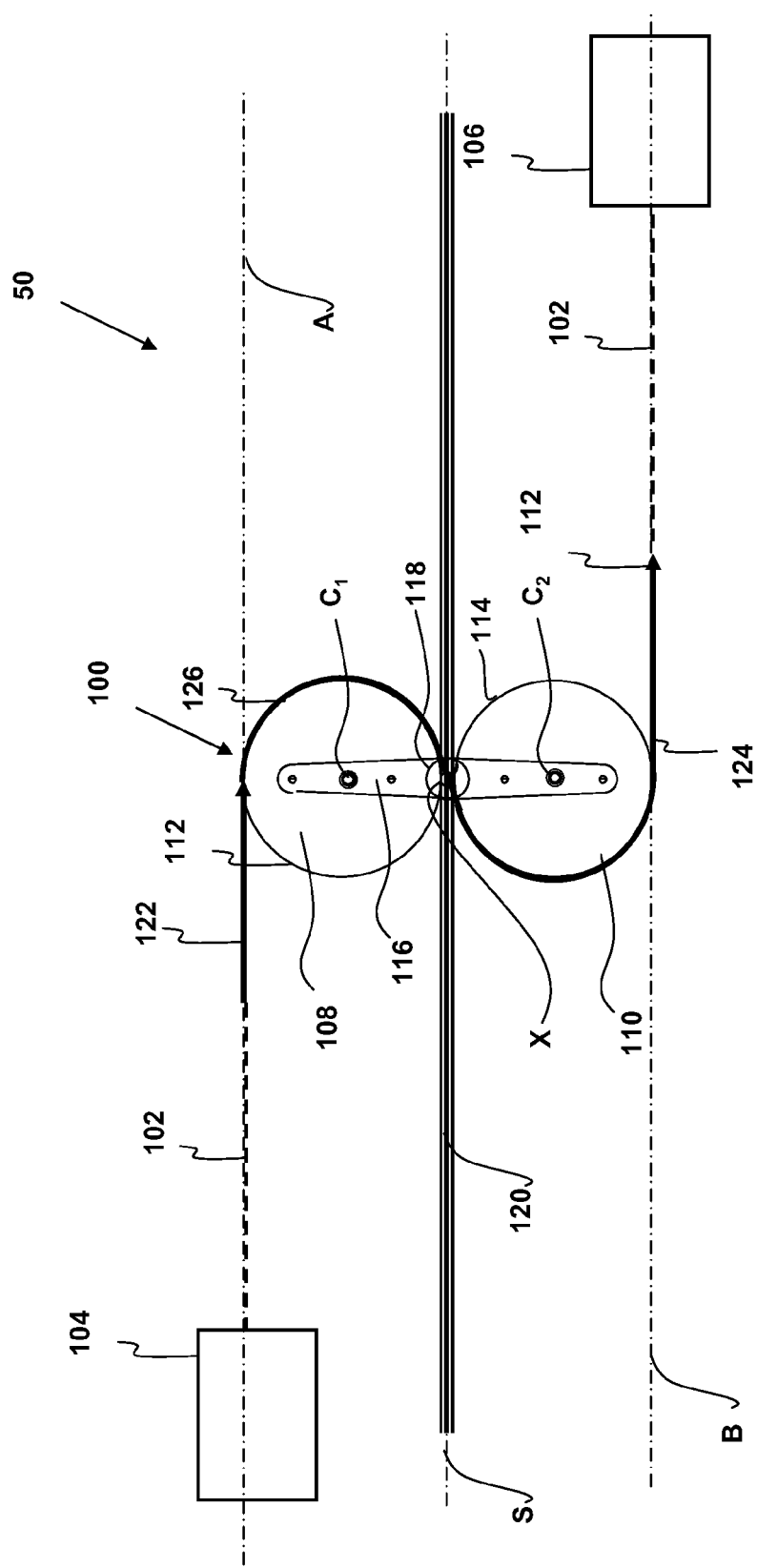
FIG. 3 is a schematic a schematic diagram of a storage reel assembly according to an embodiment of the invention.
Figure 4:
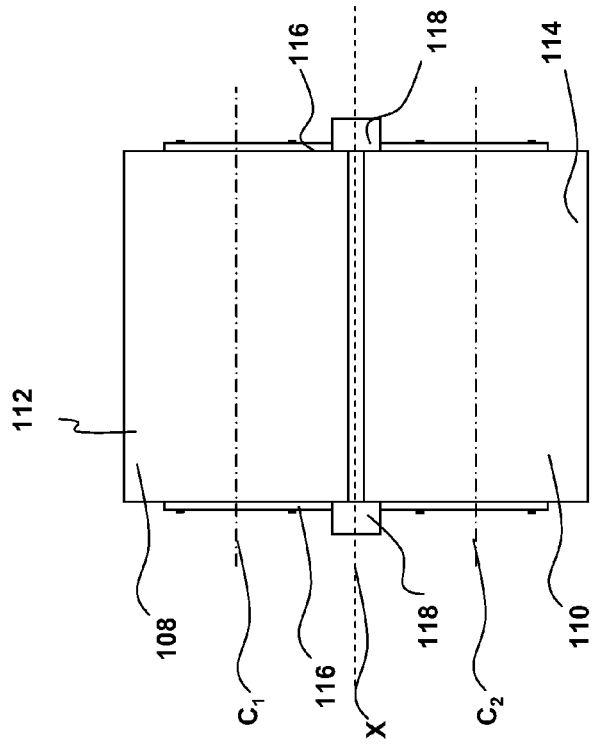
FIG. 4 is a schematic diagram of the end of a storage reel forming part of the storage reel assembly of FIG. 3.
Figure 5:
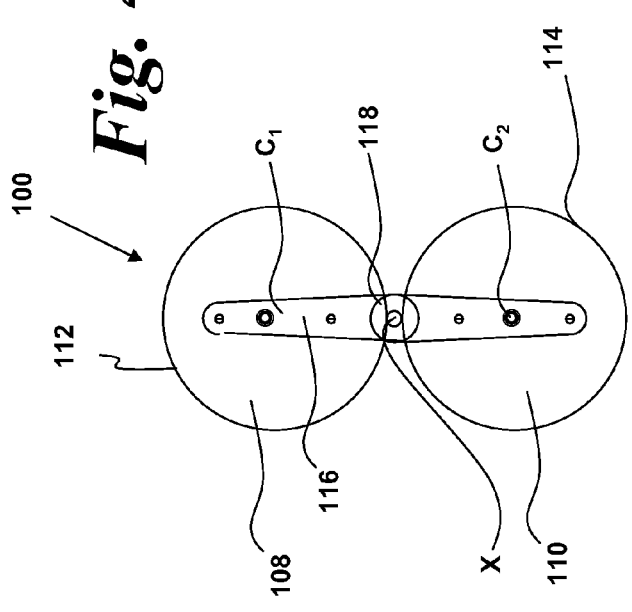
FIG. 5 is a schematic diagram of the side of the storage reel shown in FIG. 4.
Figure 6:
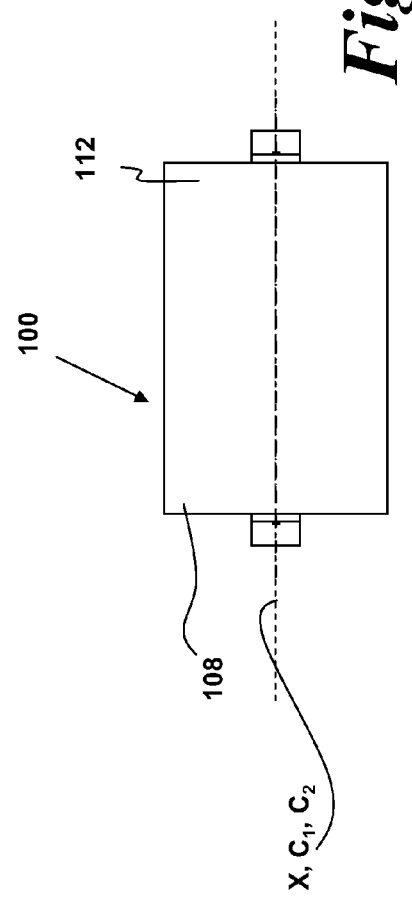
FIG. 6 is a schematic diagram of a plan view of the storage reel shown in FIG. 4.

FIG. 3 shows a storage reel assembly 50 according to an embodiment of the invention. The storage reel assembly 50 comprises a storage reel 100 arranged to receive a cable 102. FIGS. 4 to 6 show the storage reel 100 isolated from the cable 102. FIGS. 7 to 9 show the storage reel 100 with the cable located thereon.

In this embodiment, the cable 102 is a fibre optic cable comprising a glass core surrounded by cladding and a protective buffer and jacket. The cable 102 has a minimum bend radius $R_{min}$ of approximately 5 mm. However, this is not to be taken as limiting and the skilled person would readily be aware that suitable cables may have different minimum bend radii, depending upon the application and structure of the cable.

Further, alternative cable types could be used; for example, alternative fibre optic cables (for example, plastic core cables), coaxial cables, conventional copper cables or other types of cable. The skilled person would be readily aware of alternative types of cable that could be used with the present invention.

In FIG. 3, a general schematic of a typical installation is shown in which the cable 102 is connected between two devices. The cable 102 is connected at a first end to a first device 104 and at a second end to a second device 106. The first and second devices 104, 106 may comprise any suitable devices; in general, the devices 104, 106 will comprise electronic or computing devices. For example, the first device 104 may comprise a fixed controller unit and the second device 106 may comprise a hard disk drive mounted on a movable drawer as will be described later.

As shown in FIGS. 3 to 6, the storage reel 100 comprises first and second cable reels 108, 110. The first cable reel 108 comprises a cylinder having a first reeling surface 112. The second cable reel 110 also comprises a cylinder and has a second reeling surface 114. Each of the first and second reeling surfaces 112, 114 is arranged to receive wound cable 102 and to enable cable 102 to be reeled onto and off the reeling surfaces 112, 114.

Figure 2:
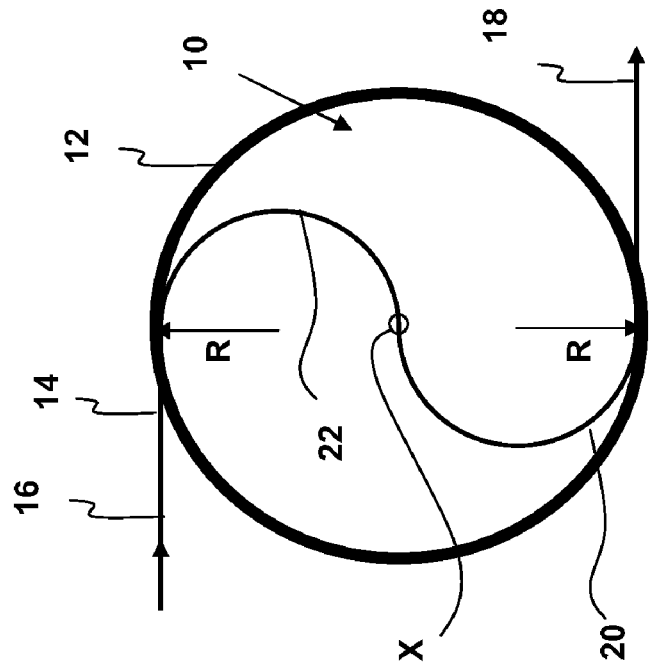
FIG. 2 is a schematic diagram of a conventional cable reel showing the cable in a reeled position.
Figure 1:
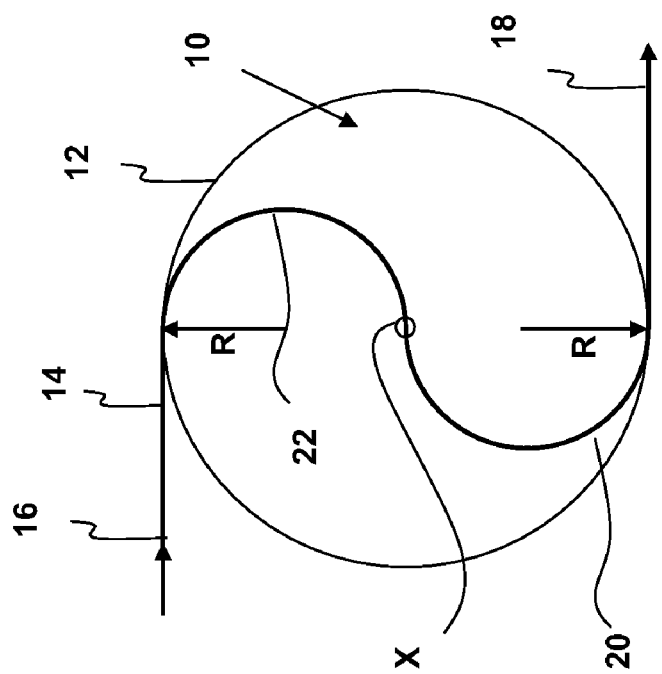
FIG. 1 is a schematic diagram of a conventional cable reel showing the cable in an extended position.

In order to preserve the integrity of the cable 102 and to maximise the efficient use of available space for cable storage, the storage reel 100 must not bend the cable to a radius greater than the minimum bend radius. Consequently, the conventional cable reel 10 shown in FIGS. 1 and 2 has a minimum diameter sufficient to accommodate the planar S-shaped guide 22. Therefore, the minimum diameter of a conventional cable reel 10 is necessarily four times the minimum bend radius of the cable, or $4R_{min}$.

However, in this embodiment, by utilising two smaller, spaced reels 108, 110 to provide a combined reeling surface to store the reeled cable 102, a smaller size can be achieved. Therefore, in order to ensure that the minimum bend radius of the cable 102 is not violated, the radius of each cable reel 108, 110 must be at least $R_{min}$. Consequently, the diameter of each cable reel 108, 110 is, at a minimum, $2R_{min}$. This provides significant space saving when compared to the arrangement shown in FIG. 1.

The first cable reel 108 has a central axis $C_1$. The second cable reel 110 has a central axis $C_2$. In this embodiment, the axes $C_1$ and $C_2$ are parallel to one another. The axes $C_1$ and $C_2$ are also spaced from one another.

The first and second reels 108, 110 are connected by at least one connecting member 116 forming part of the storage reel 100. In this embodiment, two connecting members 116 are provided, with one connecting member 116 being located at each end of each cable reel 108, 110. However, alternative constructions are possible and the skilled person would readily be aware of variations that could be used.

Each connecting member 116 comprises, in this embodiment, a finger which extends between the first and second cable reels 108, 110. In this embodiment, the connecting members 116 are each secured in four places—with two fixings per cable reel 108, 110 (illustrated by the circular fix points in FIGS. 3 and 4). Therefore, the cable reels 108, 110 are fixed relative to one another and are unable to rotate about their respective central axes $C_1$, $C_2$. However, alternative fixing arrangements may be used.

The connecting members 116 are arranged to support the first and second cable reels 108, 110 is a fixed, spaced-apart relationship. The connecting members 116 are arranged to space the first and second cable reels 108, 110 by a predetermined amount such that the cable 102 can be run between them. This is shown in FIGS. 7 to 9 and will be described later.

Each connecting member 116 comprises a slide mounting 118 for connection to a slide rail 120 forming part of the storage reel assembly 50. The slide mountings 118 may comprise any suitable mounting configuration which can allow relative movement between the connecting member 116 and the slide rail 120. The slide mountings 118 may comprise, for example, lugs which engage with cooperating grooves in the slide rails 120. Alternatively, the slide mountings 118 may comprise pins, bearings or other mountings which facilitate rotation and translational movement between the connecting member 116 and the slide rail 120.

The slide rails 120 are shown schematically in FIG. 3. The slide mounting 118 and slide rails 120 enable the storage reel 100 to be slideably movable along the slide rails 120 between the first and second devices 104, 106. In this embodiment, the storage reel assembly 50 comprises two slide rails 120, one for each side of the storage reel 100. Each slide rail 120 extends along an axis S. However, the skilled person would be readily aware that different numbers or arrangements of slide rails could be provided.

Additionally, the slide mountings 118 are adapted to enable relative rotation between the connecting members 116 and the slide rails 120. Consequently, the storage reel 100 is rotatable about an axis X which passes through the slide mountings 118 and the connecting members 116. The axis X is perpendicular to the axis S along which the slide rails 120 extend. Consequently, both of the axes X and S pass through the slide mountings 118.

With reference to FIGS. 3 and 7 to 9, the cable 102 is located on the storage reel 100 and comprises a first portion 122, a second portion 124 and a third portion 126. The first and second portions 122, 124 are located adjacent the storage reel 100. As shown in FIGS. 3 and 7, the first portion 122 of the cable 102 meets the storage reel 100 at an upper end of the first cable reel 108 of the storage reel 100. The first portion 122 of the cable 102 extends along an axis A at the point where the cable 102 meets the reeling surface 112 of the first cable reel 108. In this embodiment, the axis A is substantially perpendicular to the axis of rotation X of the storage reel 100, although this need not be so. For example, the axis A may be located at an acute angle to the axis of rotation X, depending upon the configuration of the first and second devices 104, 106 and/or the storage reel assembly 50.

In FIGS. 3 and 7, the second portion 124 of the cable 102 extends away from a lower portion of the second cable reel 110 of the storage reel 100 along an axis B. In this embodiment, the axis B is substantially perpendicular to the axis of rotation of the storage reel 100, although this need not be so. For example, the axis B may be located at an acute angle to the axis of rotation X, depending upon the configuration of the first and second devices 104, 106 and/or the storage reel assembly 50. The axis B is also parallel to, and spaced from, the axis A along which the first portion 110 of the cable 102 extends. Therefore, the first and second portions 122, 124 extend along paths which are parallel to, and spaced from, one another. However, this need not be so and, as shown in FIG. 8, the paths along which the first and second portions 122, 124 may extend at an angle to one another.

It is to be understood that, since the cable reels 108, 110 are movable about the axis X, the terms "upper" and "lower" used herein are used for clarity and necessarily refer only to the configuration shown in the Figures herewith. In other words, it is only necessary for the first and second portions 122, 124 to be spaced apart from one another at opposite ends of the storage reel 100. Which portion of the storage reel 100 is "upper" and which is "lower" is mentioned only for clarity of understanding; clearly, such terminology is irrelevant in a rotating system which may come to rest in any suitable orientation.

The third portion 126 of the cable 102 is located between the first and second portions 122, 124. The third portion 126 is formed into an S-shape with a radius of curvature which at no point is less than the minimum bend radius of the cable 102.

As is shown most clearly in FIG. 7, the third portion 126 of the cable 102 passes around a part of the reeling surface 112 of the first cable reel 108, through the space between the first and second cable reels 108, 110 and around a part of the reeling surface 114 of the second cable reel 110. As shown in FIG. 7, the third portion 126 of the cable 102 is formed into an S-shape, i.e. the third portion 126 follows a path which changes direction twice between the first and second portions 122, 124 and which follows the opposite side of the second reeling surface 114 to that of the first reeling surface 110.

FIGS. 8 and 9 show the cable 102 wrapped around the storage reel 100 and stored thereon. This may be achieved by rotating the storage reel clockwise (relative to FIG. 7) such that the cable 102 is drawn onto the cable reels 108, 110 and wrapped therearound.

Some parts of the cable 102 pass adjacent the reeling surfaces 112, 114, and other parts pass in a straight line between the cable reels 108, 110. Consequently, both of the first and second reeling surfaces 112, 114 of the first and second cable reels 108, 110 respectively function as a combined storage reel surface for the cable 102. In other words, the cable 102 is wrapped around a part of each of the reeling surfaces 112, 114 when stored thereon.

However, despite the irregular and asymmetric path taken by the cable 102 when wound onto the storage reel 100, no part of the cable 102 experiences a bend radius less than that of the cable reels 108, 110. Therefore, when wound onto the storage reel 100, the cable 102 will not have a bend radius less than the minimum bend radius of the cable 102.

FIG. 10 shows an alternative embodiment of storage reel 150. In FIG. 10, for clarity, the same reference numerals have been used for features in common with the previous embodiment. The FIG. 10 embodiment differs from the earlier embodiment in that instead of having a slot or space between the cable reels 108, 110, the cable reels 108, 110 are formed from, and form part of, a unitary piece of material.

In this arrangement, connecting walls 152 fill the space between the cylindrical portions of the cable reels 108, 110 and secure the cable reels 108, 110 to one another. An aperture 154 is provided between the connecting walls 152 to enable the cable 102 to pass therethrough. This arrangement may find application in situations where it is necessary to clamp the cable 102 as it passes between the cable reels 108, 110, so that the cable 102 cannot slide with respect thereto.

Figure 11:
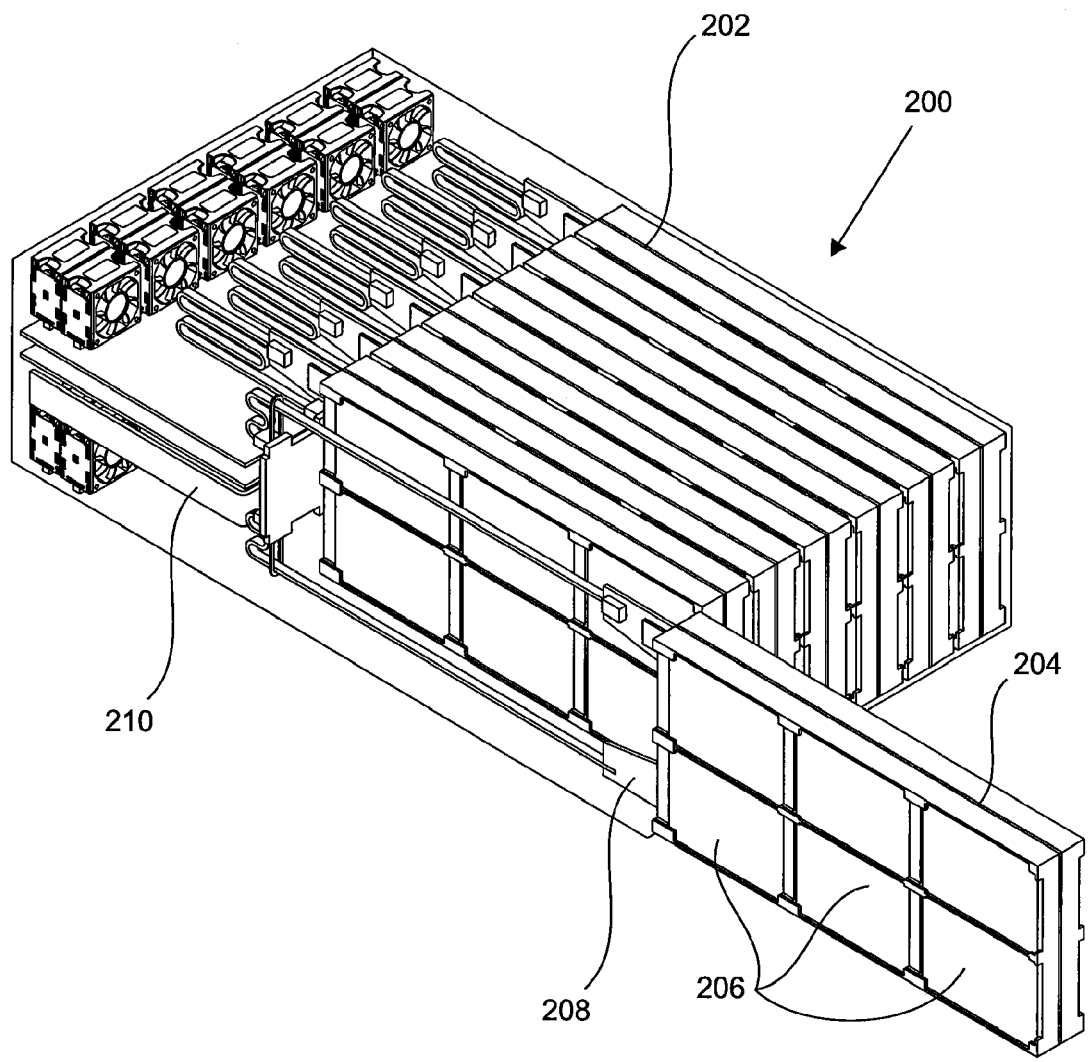
FIG. 11 is an isometric schematic view of a storage system in which the storage reel assembly of FIG. 3 and the storage reels of FIGS. 4 to 10 may be used.
Figure 13:
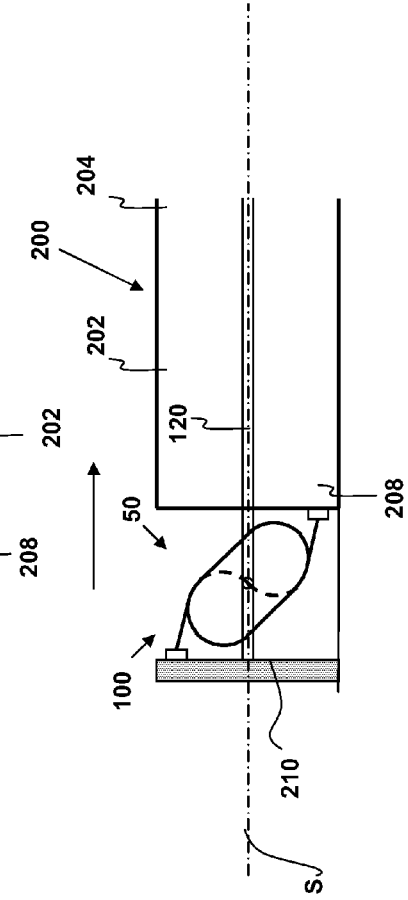
FIG. 13 is a schematic side view of the storage system of FIG. 11 incorporating a storage reel according to the invention and showing a drawer of the storage system in a partially extended position.
Figure 14:
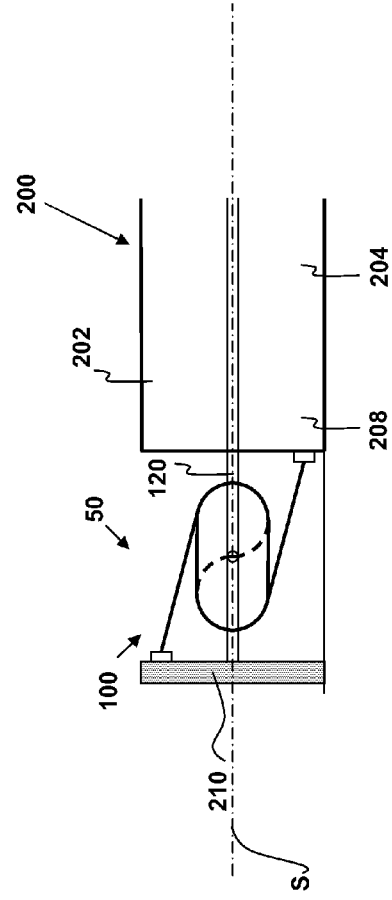
FIG. 14 is a schematic side view of the storage system of FIG. 11 incorporating a storage reel according to the invention and showing a drawer of the storage system in a further extended position.

FIG. 11 shows a possible application of embodiments of present invention. FIG. 11 shows an isometric view of a storage system 200. The storage system 200 comprises a frame 202 within which is mounted a plurality of movable drawers 204. The drawers 204 may be mounted on rollers (not shown) and can be slid out of the frame 202 (as shown in FIGS. 13 and 14) to permit access to the content of the drawers 204.

A plurality of hard disk drives (HDDs) 206 is located in each drawer 204. In this embodiment, each drawer comprises twelve HDDs 206, with two arrays of six HDDs 206 arranged back to back. An individual HDD 206 can be removed from the storage system 200 by sliding a respective drawer 204 out and disconnecting the HDD 206 in question without affecting the operation of other HDDs 206 in a given drawer 204.

At the rear end of each drawer 204 is provided an interconnect 208 for connecting the HDDs 206 of that drawer 204 to other components of the storage system 200. In this embodiment, the interconnect 208 comprises a parallel optical transceiver attached to the rear end of each drawer 204. The transceiver comprises a parallel optical interface (for example, of the MT or MPO standard) and can accommodate a fibre optic cable such as the cable 102 described previously.

At the rear of the frame 202 is mounted an optical printed circuit board (optical PCB) 210. An optical PCB is a circuit board which includes one or more optical communication layers and will typically include one or more electrical communication and power layers. In some cases, the optical PCB 210 may comprise an optical backplane. The optical PCB 210 comprises optical interconnects and is arranged to connect the storage system 200 to other components of a computer system or a network.

Figure 12:
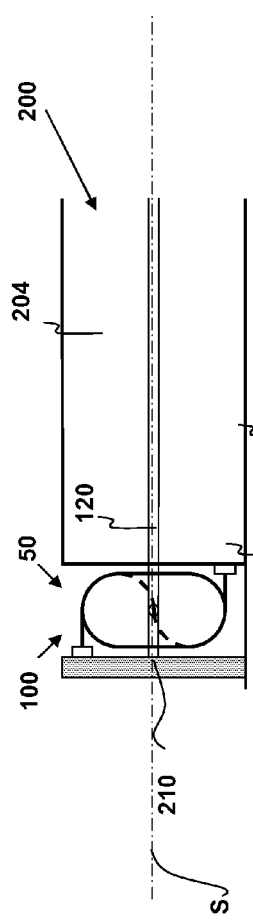
FIG. 12 is a schematic side view of the storage system of FIG. 11 incorporating a storage reel according to the invention and showing a drawer of the storage system in a retracted position.

FIGS. 12 to 14 show side schematic views of the storage system 200 comprising a storage reel assembly 100 according to the invention. Only a single drawer 204 is shown in these figures for clarity. In FIG. 12, the drawer 204 is shown fully retracted into the frame 202 of the storage system 200. In FIG. 13, the drawer 204 is shown partially extended from the frame 202. In FIG. 14, the drawer 204 is shown further extended from the frame 202 in order to facilitate, for example, access to the HDDs 206 contained therein.

The storage reel assembly 50 is shown in FIGS. 12 to 14 and is arranged to reel a cable 102 thereon. The cable 102 comprises a multimode fibre optic cable which is connected between the interconnect 208 and the optical PCB 210.

The storage reel assembly 50 is arranged to be moveable with the drawer 204 such that, as the drawer 204 is extended, the cable 102 extends from the storage reel 100 in both directions. As the drawer 204 is extended, the storage reel 100 rotates about the axis X and moves along the axis S on the slide rails 120 away from the optical PCB 210. The storage reel 100 moves at an average rate which is half of the rate of movement of the drawer 204. Additionally, the storage reel 100 may be spring loaded on its axis to bias the cable reel assembly 100 to reel the cable 102 back in when the drawer 204 is closed.

In the example application shown in FIGS. 11 to 14, when stored, the width (i.e. the dimension in the direction of the axis S) of the end of the storage reel 100 is more space-critical than the height thereof. This is because of the nature of the packing arrangements of the HDDS 206 within each drawer, whereby the "narrower" the storage reel 100 is, the greater the number of HDDs 206 that can be accommodated within a drawer 204.

Therefore, as shown in FIGS. 12 to 14, the asymmetric arrangement of the storage reel 100 enables the storage reel 100 to fit in a relatively small space between the drawer 204 and the optical PCB 210. When the drawer 204 is fully closed (as shown in FIG. 12), the storage reel 100 is in a vertical position whereby the first cable reel 108 is located directly above the second cable reel 110. Consequently, in this configuration, the shortest dimension of the storage reel 100 is between the drawer 204 and the optical PCB 210.

In this position the storage reel 100 takes up the minimum possible amount of space between the drawer 204 and the optical PCB 210, so that the drawer 204 can be as large as possible.

As the drawer 204 is withdrawn (FIGS. 13 and 14), the storage reel 100 rotates about the axis X as cable 102 is pulled therefrom. In fact, the first and second cable reels 100 both orbit the axis X at a distance equal to the respective distance between the axes $C_1$, $C_2$ and the axis X.

As the drawer is extended, the rotation of the storage reel 100 will cause the storage reel 100 to assume a horizontal configuration (as shown in FIG. 14). In other words, at this point the storage reel 100 has rotated through 90° and is taking up the maximum amount of room between the drawer 204 and the optical PCB 210. However, at this stage, sufficient cable 102 will have unwound at both ends of the storage reel 100 so that the storage reel 100 will foul neither the drawer 204 nor the optical PCB 210.

In order to ensure that the cable 102 is wound back onto the storage reel 100 when the drawer 204 is pushed back in to the closed position, a spring (not shown) or another suitable type of resilient means may be incorporated to urge the storage reel 100 to rotate clockwise in order to wind the cable 102 thereon. Various alternative approaches to this will be apparent to the skilled person; for example, a spiral spring located one or both of the slide mountings 118 may be used.

The arrangement of the present invention enables a cable reel to have a smaller diameter without exceeding the maximum bending requirements of a cable. Therefore, as shown in FIGS. 11 to 14, the reduced space required for the cable reel enables the density of HDDs 206 in a storage system 200 to be increased. Therefore, the information density of the storage system 200 can be increased for a given physical size or footprint.

Variations of the above embodiments will be apparent to the skilled person. The precise configuration of hardware and software components may differ and still fall within the scope of the present invention. For example, whilst the embodiments above have been described with reference to communication cable, the embodiments may also be used for electrical cable for the transmission of electrical power to electronic devices.

Further, the gap between the cylinders may be increased to a dimension greater than that needed for the cable to pass through.

Embodiments of the present invention have been described with particular reference to the examples illustrated. While specific examples are shown in the drawings and are herein described in detail, it should be understood, however, that the drawings and detailed description are not intended to limit the invention to the particular form disclosed. It will be appreciated that variations and modifications may be made to the examples described within the scope of the present invention.

The invention claimed is:

1. A storage reel for storage of cable, said cable being connectable to electronic and/or optical devices and said storage reel comprising:
   a first cable reel having a first reeling surface arranged to store wound cable thereon;
   a second cable reel having a second reeling surface arranged to store wound cable thereon; and
   a connecting member arranged to connect said first and second cable reels,
   wherein the storage reel is rotatable about an axis such that, in use, the storage reel is operable to wind cable across both the first and second reeling surfaces.

2. A storage reel according to claim 1, wherein at least one of the first and second cable reels is cylindrical.

3. A storage reel according to claim 2, wherein both the first and second cable reels are cylindrical.

4. A storage reel according to claim 3, wherein the first and second cable reels each have an axis and the axes of each of the first and second cable reels are parallel and spaced from one another.

5. A storage reel according to claim 4, wherein the axis of each of the first and second cable reels is parallel and spaced from the axis of rotation.

6. A storage reel according to claim 4, wherein the storage reel extends in first and second dimensions perpendicular to the axis of rotation, and the storage reel is dimensioned to extend at least twice as far in the first dimension as the second dimension.

7. A storage reel according to claim 1, wherein the storage reel is asymmetric in different dimensions perpendicular to the axis of rotation.

8. A storage reel according to claim 1, further operable to locate said cable thereon by passing said cable around at least a part of said first reeling surface, between said first and second cable reels and around at least a part of said second reeling surface.

9. A storage reel according to claim 8, wherein said first and cable reels are spaced to enable said cable to pass therebetween.

10. A storage reel according to claim 8, wherein said first and second cable reels form part of a unitary structure, said unitary structure comprising an aperture between said first and second cable reels operable to enable said cable to pass therethrough.

11. A storage reel according to claim 1, wherein said cable comprises electrical cable for transmission of electrical power.

12. A storage reel according to claim 1, wherein said cable comprises communication cable for transmission of optical or electronic signals.

13. A storage reel according to claim 12, wherein said cable comprises a fibre optic cable.

14. A storage reel according to claim 1, wherein the axis passes through said connecting member between said first and second cable reels.

15. A storage reel assembly, comprising at least one slide rail and the storage reel of claim 1, wherein said at least one slide rail has an axis and is operable to enable said storage reel to slide thereon along said axis.

16. A storage reel assembly according to claim 15, wherein the axis of said slide rail is coincident and perpendicular to said axis of rotation of said storage reel.

17. A storage device for containing electronic components, said storage device comprising:
   a frame; and
   at least one drawer movable with respect to said frame;
   said frame comprising a first electronic device and said drawer comprising a second electronic device, said first and second devices being connected by cable,
   wherein said cable comprises electrical or communication cable and is stored on a storage reel according to claim 1.

18. A storage device according to claim 17, wherein said first electronic device comprises an optical printed circuit board and said second electronic device comprises at least one data storage device.

19. A storage device according to claim 18, wherein the or each data storage device comprises a hard disk drive.

20. A method of storing cable, said cable being connectable to electronic and/or optical devices and said method comprising:
   providing a storage reel, said storage reel being rotatable about an axis and having:
      a first cable reel having a first reeling surface arranged to store wound cable thereon;
      a second cable reel having a second reeling surface arranged to store wound cable thereon; and
      a connecting member arranged to connect said first and second cable reels, the method further comprising:
      the method further comprising:
         receiving a first part of the cable at a portion of said first reeling surface;
         receiving a second part of the cable at a second portion of said second reeling surface; and
         guiding the cable around said first reeling surface, between said first and second cable reels, and around said second reeling surface.

21. A method according to claim 20, further comprising winding cable across both the first and second reeling surfaces to store said cable thereon.

22. A method according to claim 20, wherein said cable comprises electrical cable for transmission of electrical power.

23. A method according to claim 20, wherein said cable comprises communication cable for transmission of optical or electronic signals.

* * * * *